United States Patent [19]

Watson

[11] Patent Number: 5,329,269

[45] Date of Patent: Jul. 12, 1994

[54] SINGLE CORE TRIAXIAL FLUX-GATE MAGNETOMETER

[76] Inventor: William S. Watson, 3026 Aspen Ct., Eau Claire, Wis. 54703

[21] Appl. No.: 782,488

[22] Filed: Oct. 25, 1991

Related U.S. Application Data

[63] Continuation-in-part of Ser. No. 565,794, Aug. 10, 1990.

[51] Int. Cl.$^5$ ............................................. H01F 27/24
[52] U.S. Cl. ..................................... 336/213; 29/609; 324/247; 336/188; 336/229; 336/234
[58] Field of Search .................... 29/609; 324/247; 336/213, 234, 233, 229, 118

[56] References Cited

U.S. PATENT DOCUMENTS

| | | |
|---|---|---|
| 510,640 | 12/1893 | Hornberger . |
| 553,847 | 2/1896 | Freeman . |
| 1,406,245 | 2/1922 | Thordarson . |
| 1,933,140 | 10/1933 | Gakle . |
| 2,199,116 | 4/1940 | Sanders . |
| 2,220,732 | 11/1940 | Sanders . |
| 2,220,733 | 11/1940 | Sanders . |
| 2,246,239 | 6/1941 | Brand . |
| 2,246,240 | 6/1941 | Brand . |
| 2,269,726 | 1/1942 | Martin . |
| 2,282,854 | 5/1942 | Driftmeyer . |
| 2,314,912 | 3/1943 | Troy . |
| 2,333,015 | 10/1943 | Kramer et al. . |
| 2,367,927 | 1/1945 | Chubb . |
| 3,153,215 | 10/1964 | Burkhardt et al. . |
| 3,303,449 | 2/1967 | Stimler . |
| 3,621,382 | 11/1971 | Valet . |
| 3,800,213 | 3/1974 | Rorden ............... 324/43 R |
| 4,366,520 | 12/1982 | Finke et al. . |
| 4,462,165 | 7/1981 | Lewis . |
| 4,521,957 | 6/1985 | McLeod . |
| 4,557,039 | 12/1985 | Manderson ............... 336/234 |
| 4,588,971 | 5/1986 | Basser ............... 336/213 |
| 4,825,166 | 4/1989 | MacGugan . |
| 4,851,775 | 7/1989 | Kim et al. . |

FOREIGN PATENT DOCUMENTS

| | | |
|---|---|---|
| 521125 | 5/1940 | Fed. Rep. of Germany . |
| 52-58818 | 5/1977 | Japan ............... 336/213 |
| 671627 | 5/1952 | United Kingdom ............... 336/234 |
| 830094 | 3/1960 | United Kingdom ............... 336/213 |

OTHER PUBLICATIONS

Article by William A. Geyger, *Flux-Gate Magnetometer;* Jun. 1, 1962, labelled Reference 1.
Article by Doug Garner, *A Magnetic Heading Reference for the Electro Fluidic Autopilot;* Sport Aviation, Labelled as Reference 2.
Article by Stanley V. Marshall, *An Analytic Model for the Fluxgate Magnetometer;* Labelled as Reference 3.
A Brochure for Domain Magnetics, Pubs No. DTM 0010, Labelled as Reference 4 *Dual and Three Axis Magnetometers.*
A Brochure for Develco, Inc., *Fluxgate Magnetometer, Model 9200C;* Aug., 1982, Labelled as Reference 5.

*Primary Examiner*—Thomas J. Kozma
*Attorney, Agent, or Firm*—Moore & Hansen

[57] ABSTRACT

A single core triaxial flux-gate magnetometer including a tall-toroidal core having a radial excitation winding, two orthogonal sets of axial or circumferential output windings, and an equatorial output winding oriented orthogonal to both axial output windings. The core is fabricated from a strip of magnetic tape material wrapped to form a toroid having a height ranging from approximately equal to its diameter to one and one half times its diameter. Each end of the strip is uniformly tapered along the top and bottom edges such that the tapered segments extend around an integer multiple of complete revolutions of the wrapping, the length of each tapered segment thereby being equal to the inner or outer circumference of the toroid or an integer multiple thereof. Leakage of the induced magnetic field at any point along the edge of the tapered segment will be generally proportional to the height of the tapered segment between its edges at that point, and will extend with equal magnitude in opposite directions from the strip parallel to the planar surface of the toroid and perpendicular to the edges. The tapered segments are oriented and aligned relative to one another in the wrapped toroid such that the induced magnetic field leakage is generally symmetrical and balanced across any diameter of the core.

17 Claims, 2 Drawing Sheets

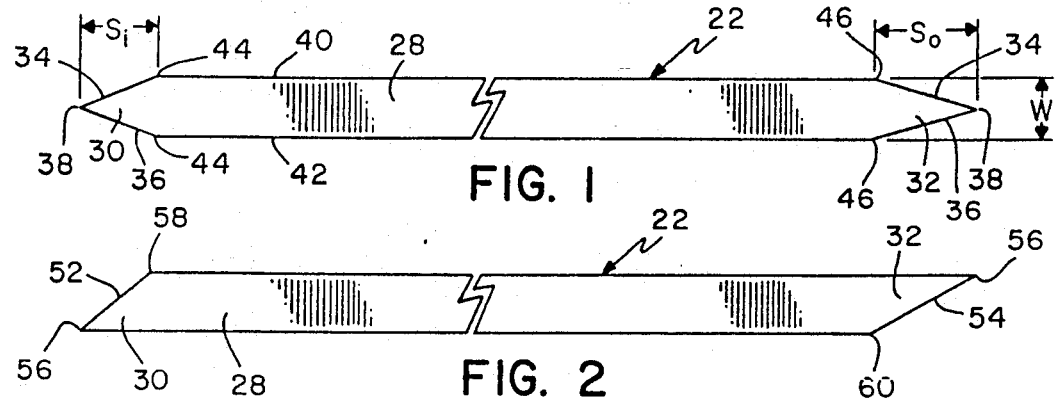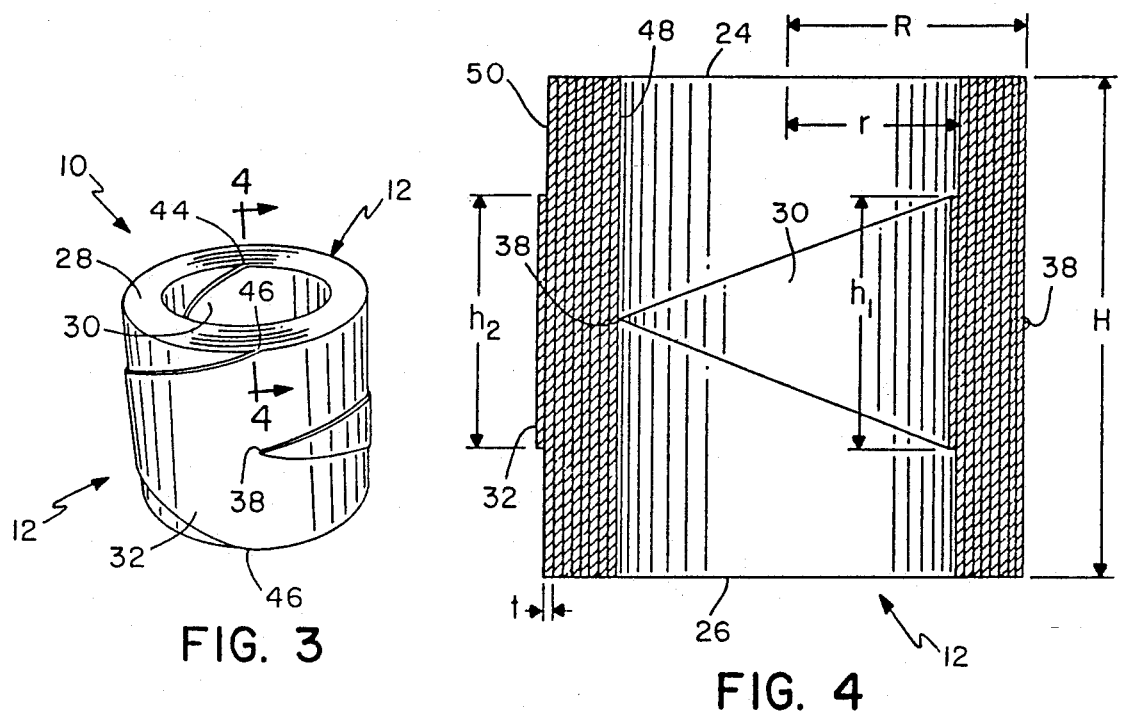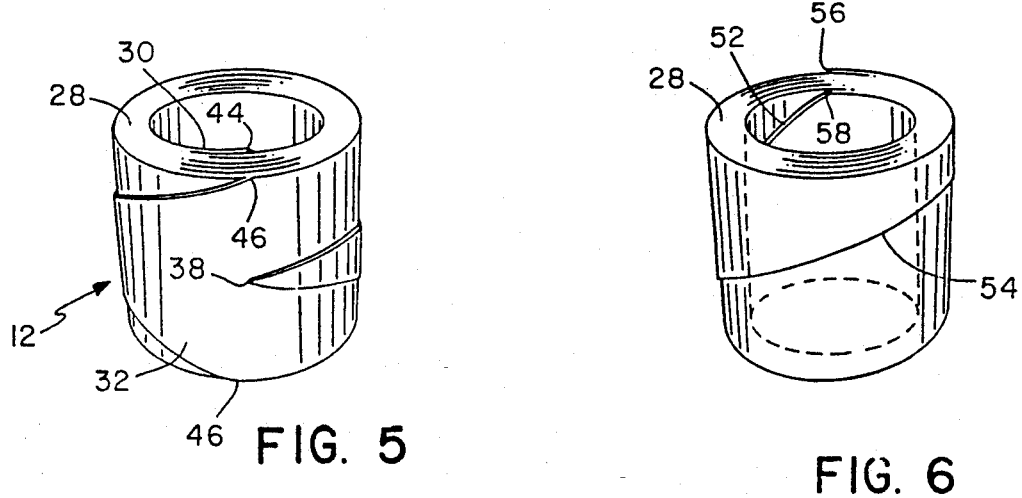

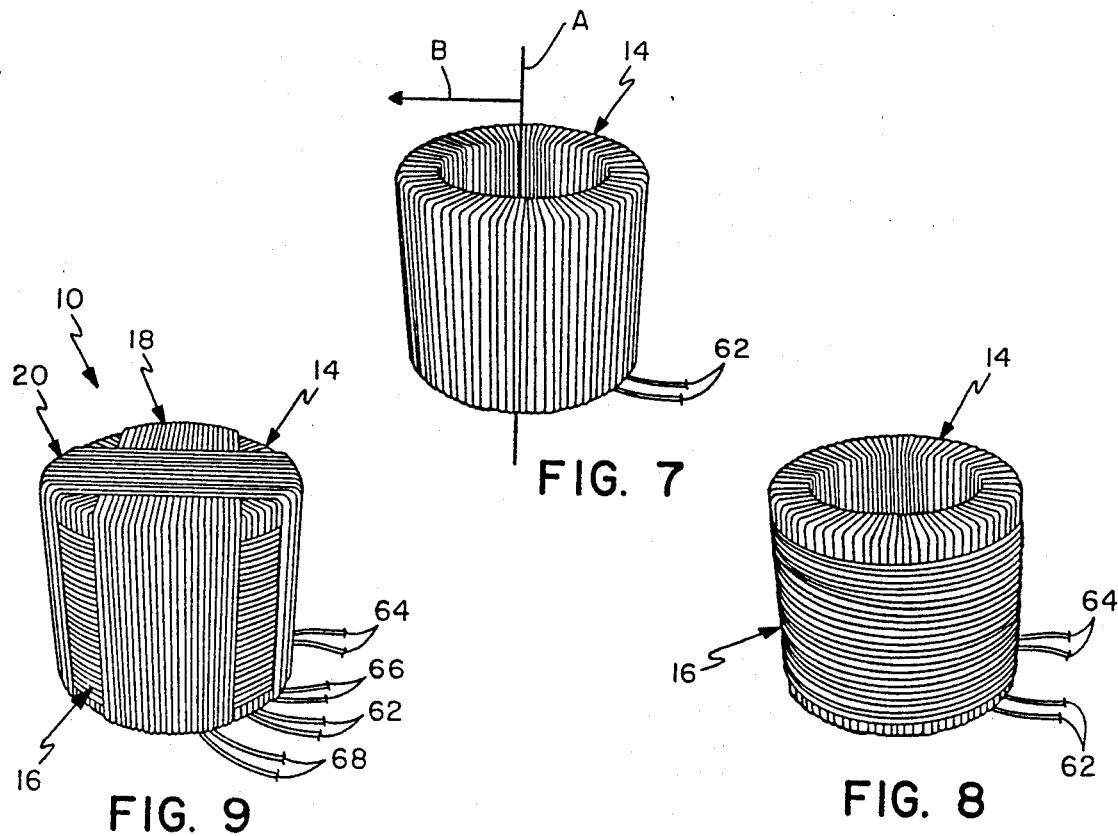
FIG. 7
FIG. 8
FIG. 9
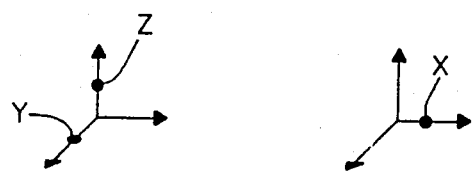
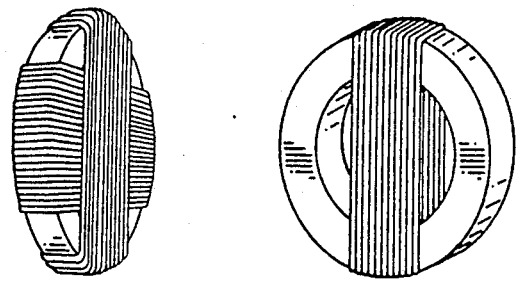
FIG. 10 (PRIOR ART)

SINGLE CORE TRIAXIAL FLUX-GATE MAGNETOMETER

This application is a continuation-in-part of the co-pending United States Patent application Ser. No. 07/565,794 filed on Aug. 10, 1990.

BACKGROUND OF THE INVENTION

1. Field of the Invention

This invention relates generally to component system flux-gate magnetometers of the tall-toroidal type, and particularly to a single core three axis magnetometer having a magnetic tape core.

2. Description of the Prior Art

The term magnetometer refers to instruments for measuring weak magnetic fields, the upper limit generally being considered the maximum intensity of the earth's magnetic field. Magnetometers are commonly divided into three classifications: mechanical magnetic balances, which compare the magnetic field intensity to a known force (gravity, torsion, etc.); component systems, which measure the effect of the magnetic field intensity or changes in the magnetic field intensity along an axis of a sensor (coils, Hall effect, electron beam); and spin-precession detectors, which monitor the interaction of the magnetic field with energized or moving atomic particles (proton free precession, optical pumping, and monitoring types.) The first two classifications are generally grouped under the broader heading of electronic magnetometers.

Electronic magnetometers measure one vector component of the magnetic field, and are therefore orientation dependent. Relative field intensity is determined by amplitude variation, therefore requiring accurate calibration and tuning for optimal performance. Traditionally, the term magnetometer has referred to a single field sensing unit, with two or three orthogonal sensing units being combined to measure the total magnetic field. Commercial devices which measure more than one orthogonal vector are thus termed two-axis (biaxial) or three-axis (triaxial) multi-component system magnetometers.

In some types of component systems, the sensing devices are fixed relative to the magnetic field vector component being observed. The two most frequently employed examples are flux-gates and search-coils.

A flux-gate consists of a high permeability core in which the ambient field induces a magnetization. A primary or excitation winding around the core is electronically stimulated using alternating current until the core reaches saturation. Secondary, sensing, or output windings measure the asymmetry of the magnetization in the core resulting from the superimposed ambient field, which appears as a second harmonic of the sweep or excitation frequency. The resultant output is most commonly a voltage proportional to the particular vector component's field strength or intensity.

In contrast, search-coils measure variations of the ambient field which induce voltages in the primary winding proportional to the change in field or frequency over time. Since response falls off to zero at low frequencies, these devices function only as variometers.

Flux-gate sensor cores may generally be of an open or closed configuration. Four common types of flux-gate sensor cores have well defined analytical characteristics: single rod, double rod, toroid or ring core, and tall-toroidal core. (The term tall-toroid is used herein to describe a hollow cylindrical tube or annulus.)

The single and double rod cores are examples of open cores, in which rods, strips, or wires of high permeability material are wound with excitation and output windings, with single windings being used in some applications for both excitation and output as in the case of search-coils. The second harmonic of the output voltage is obtained by filtering. In double rod core systems, the rods are arranged in opposition (i.e., two parallel spaced-apart rods having the direction of the excitation windings and induced field opposing one another) with the output windings surrounding both rods generally perpendicular to their lengths.

In toroid or ring cores, the core is generally formed from a curved rod or disk of malleable high permeability material having a circular or square half-annular cross section, and may have a circular or elliptical overall shape. The excitation windings are wound toroidally, while the output windings are wound either toroidally or circumferentially (axially) across the diameter of the ring core. In tall-toroidal cores, the core material is molded or machined to the desired dimensions in the shape of a hollow cylindrical tube or annulus, with the core having a generally rectangular half-annular cross section with a height greater than the radial thickness. The excitation windings are again wound toroidally, and the output windings may be wound equatorially rather than axially.

Iron and various high permeability materials (mu metal coated glass rods, Supermalloy, TM Permalloy 80 TM) have proven suitable for forming many types of flux-gate cores. One improvement has been the use of a very high permeability magnetic tape material in single rod cores. U.S. Pat. No. 4,851,775 to Kim describes a very small single rod core using a straight strip of magnetic tape material (Metglas TM amorphous alloy 2705M) having a length dimension of 1.8 cm, width dimension of 0.5 mm, and a thickness of 20 $\mu$m. This type of a magnetic tape material provides advantages in fabricating such a core due to the methods by which the material can be handled and worked.

While magnetic tape materials have proven preferable for single and double rod cores, a significant disadvantage remains in attempting to form a tall-toroidal core from a planar magnetic tape material—namely, the ends of the magnetic tape strip form discontinuities that "leak" the induced magnetic field orthogonal to the preferred orientation of the induced field, thereby overlapping the ambient field along at least one field vector component and creating unwanted output signal noise. Filtering this signal noise requires more complicated circuitry and greatly increases the cost of both single- or multi-component systems. While magnetic tape materials may be utilized in single-axis component systems where the output windings may be oriented parallel with the leakage of the induced field, the magnetic tape materials have proven less than optimal for multi-axis sensors -where the leakage must necessarily affect sensing along at least one vector component.

Various methods of producing a multi-component system incorporating biaxial or triaxial sensors are known. Conventional triaxial sensors are produced using a first biaxial ring core sensor having two orthogonal axial output windings to measure two field vector components, in combination with a second single-axis ring core having one axial output winding oriented orthogonal to both vector components of the biaxial ring core sensor and spaced apart therefrom by approximately one half the core diameter. Such a prior art triaxial multi-component system is shown in FIG. 10 herein. The left sensor core includes two axial or circumferential output windings which measure field vector components relating to the marked Y- and Z-axes, while the right sensor core includes a single axial or circumferential output winding oriented orthogonal to both the output windings of the left sensor core to measure the remaining field vector component relating to the marked X-axis.

Dual core systems are suitable for many terrestrial or navigational uses where the source of the ambient field is located at a distance sufficient that the parallax between the two cores may be neglected, or wherein significant heading error may be tolerated or corrected. However, such a system is unsuitable for observing near-field events where the directional vector itself rather than the magnitude of the ambient magnetic field is critical, and the angle formed between the ambient field source and the spaced-apart cores would lead to noticeable error in measurement of those field vector components. One example would be monitoring spatial orientation or telemetry of a movable object relative to a fixed alternating current reference field near or within an enclosed space, such as an aircraft or orbital vehicle. Moreover, since the cores do not saturate in exact synchronization, the "late" core will distort the surrounding field and can therefore produce significant heading errors in navigational systems.

One representative example of a three-axis sensor designed to overcome the problems of vector misalignment and asynchronization is shown in U.S. Pat. No. 4,462,165 to Lewis, which is actually a closed core system that operates on the principle of three orthogonal sets of double rod cores. While it may be appreciated that the Lewis '165 triaxial sensor may be constructed to occupy a relatively small volume with paired output windings of the three sets of spaced-apart rod cores producing a single effective centerpoint for the sensor, the fabrication of the core structure and application of the excitation and output windings are very complicated, labor intensive, and expensive processes. Moreover, fabrication of the core structure to meet uniform tolerances and specifications can be very difficult.

BRIEF SUMMARY OF THE INVENTION

It is therefore one object of this invention to design a tall-toroidal core for a flux-gate magnetometer which can be easily fabricated using a high permeability magnetic tape material, but wherein induced field leakage does not detrimentally affect sensing of the ambient magnetic field.

It is another object of this invention to design a triaxial flux-gate magnetometer incorporating the above single tall-toroidal core which is independent of vector misalignment errors similar to those caused by linear separation between two cores (and the associated output windings) in dual core biaxial or triaxial sensors.

It is an additional object of this invention to design the above triaxial flux-gate magnetometer such that it may be easily constructed in various sizes, and particularly in an embodiment having extremely small overall height and diameter dimensions.

It is a related object of this invention to design the above flux-gate magnetometer such that its fabrication and assembly may be accomplished through automated or near-automated procedures.

It is an additional object of this invention to design the above tall toroidal core and flux-gate magnetometer such that the size and mass of the core and windings may be easily optimized for given applications, and particularly such that the size and mass may be selectively maximized to increase sensitivity.

Briefly described, the single core triaxial flux-gate magnetometer of this invention preferably includes a tall-toroidal core having a radial excitation winding or coil, two orthogonal sets of axial or circumferential output windings or coils, and an equatorial output winding or coil oriented orthogonal to both the axial output windings or coils. The core is fabricated from a strip of magnetic tape material wrapped to form a toroid having a height ranging from approximately equal to its diameter to one and one half times its diameter. Each end of the strip of magnetic tape material is uniformly tapered along the top and bottom edges such that the tapered segments extend around one complete revolution of the wrapping, the length of each tapered segment thereby being equal to the inner or outer circumference of the toroid, respectively. The length of each tapered segment may alternately be any integer multiple of the inner or outer circumference, respectively, with the tapered segment extending around the core an integer multiple of revolutions. The leakage of the induced magnetic field at any point along and perpendicular to the edge of the tapered segment will be generally proportional to the height of the tapered segment between its edges at that point, and will extend with equal magnitude in opposite directions from the strip parallel to the planar surface of the toroid and perpendicular to the edges. The tapered segments are therefore oriented and aligned relative to one another in the wrapped toroid such that the height of one tapered segment along a line defined by a radial plane of the toroid is balanced by the height of a tapered segment in that plane on the opposing side of the core, such that the induced magnetic field leakage is generally symmetrical across any diameter of the core.

BRIEF DESCRIPTION OF THE DRAWINGS

FIG. 1 is a top plan view of the strip of magnetic tape material used to form the magnetometer core of this invention having two tapered edges in each tapered segment;

FIG. 2 is a top plan view of an alternate embodiment of the strip of magnetic tape material used to form the magnetometer core of this invention having one tapered edge in each tapered segment;

FIG. 3 is a front perspective view of the strip of FIG. 1 wrapped to form a tall-toroidal magnetometer core having a 180° alignment angle between the junctions of the tapered segments;

FIG. 4 is a side cross section view of the magnetometer core of FIG. 3 taken through the radial axis of the core along line 4—4 in FIG. 3;

FIG. 5 is a front perspective view of the tall-toroidal magnetometer core of FIG. 3 having a zero alignment angle between the junctions of the tapered segments;

FIG. 6 is a front perspective view of the strip of FIG. 2 wrapped to form a tall-toroidal magnetometer core having a 180° alignment angle between the Junctions of the tapered segments;

FIG. 7 is a front perspective view of the core of FIG. 1 wound radially with an excitation winding;

FIG. 8 is a front perspective view of the core of FIG. 7 additionally wound equatorially with an equatorial sensing winding;

FIG. 9 is a front perspective view of the core of FIG. 8 additionally wound circumferentially with a pair of orthogonal axial sensing windings to form the single core triaxial flux-gate magnetometer of this invention; and FIG. 10 is a front perspective view of the two spaced apart cores and associated sensing windings of a prior art dual core triaxial flux-gate magnetometer, and the diagrammatic representation for the vector components of an ambient magnetic field observed by the related sensing windings.

DESCRIPTION OF THE PREFERRED EMBODIMENTS

The single core triaxial flux-gate magnetometer of this invention is shown diagrammatically in FIGS. 1-10 and referenced generally therein by the numeral 10.

Referring particularly to FIGS. 3 and 9, the magnetometer 10 may be seen to comprise a core 12 surrounded by a primary or excitation winding or coil 14, and three sensing coils including an equatorial winding or coil 16, a first axial winding or coil 18, and a second axial winding or coil 20.

Referring to FIGS. 1 and 3, it may be seen that the core 12 is fabricated from a generally planar strip 22 of a flexible high-permeability magnetic tape material, such as Metglas ™ amorphous alloy. The strip 22 is wrapped or wound to form a tall-toroidal shaped core 12 as shown in FIG. 3.

The strip 22 thereby has a width W which is generally equal to the height H of the core 12 measured between the top 24 and bottom 26 thereof, as shown in FIG. 4.

Referring to FIG. 1, in the preferred embodiment the strip 22 defines a generally rectangular center portion 28 extending longitudinally along the strip 22, and a pair of tapered segments 30, 32 disposed at and extending from opposing ends of the center portion 28.

Each tapered segment 30, 32 defines a uniform taper along the top edge 34 and bottom edge 36 thereof such that the tapered segments 30, 32 each define a sharp end or endpoint 38 which is equidistant from the longitudinal edges 40, 42 of the center portion 28, a centerline joining or intersecting each of the endpoints 38 of the tapered segments 30, 32 being disposed generally equal distances (W/2 or H/2) from the longitudinal edges 40, 42.

Tapered segment 30 has a length $S_i$ measured from a line joining the junction 44 of the longitudinal edge 40 and top edge 34 with the junction 44 of the longitudinal edge 42 and bottom edge 36 to the endpoint 38 of the tapered segment 30. Tapered segment 32 has a length $S_o$ measured from a line joining the junction 46 of the longitudinal edge 40 and top edge 34 with the junction 46 of the longitudinal edge 42 and bottom edge 36 to the endpoint 38 of the tapered segment 32. Lengths $S_i$ and $S_o$ of the respective tapered segments 30, 32 are therefore measured generally parallel with the line joining the endpoints 38 of the tapered segments 30, 32, or alternately are represented by the minimum distance between the corresponding endpoint 38 and the lines intersecting and connecting the corresponding junctions 44, 46 and perpendicular to the corresponding longitudinal edge 40, 42 of the strip 22. As such, the line from which the lengths $S_o$ and $S_i$ are measured and the corresponding tapered edges 34, 36 form generally isosceles triangles at each end of the strip 22, the two isosceles triangles having slightly different shapes and sizes due to the difference between the lengths $S_o$ and $S_i$ which effectively bisect the two isosceles triangles.

When the strip 22 is wrapped to the tall-toroidal configuration shown in FIG. 3, tapered segment 30 extends around an integer multiple of complete revolutions of the toroidal wrapping and is disposed on the inner circumference 48 of the core 12. Conversely, tapered segment 32 extends around an integer multiple of complete revolutions of the toroidal wrapping and is disposed on the outer circumference 50 of the core 12. In the preferred embodiment described herein in relation to FIGS. 3 and 5, the integer multiple for both tapered segments 30, 32 is one single complete revolution, since this minimizes the length of the tapered edges 34, 36 for a given diameter core 12.

Consequently, given a toroidal core having an outer diameter R and an inner diameter r, the length $S_i$ of the inner tapered segment 30 will be substantially equal to $2\pi R$, while the length $S_o$ of the outer tapered segment 32 will be substantially equal to $2\pi r$, the lengths $S_i$, $S_o$ of each tapered segment 30, 32 thereby being equal to the inner or outer circumference 48, 50 of the core 12 so that each tapered segment 30, 32 makes exactly one complete revolution around the inner circumference 48 or outer circumference 50 of the wrapped core 12, respectively. As such, the junctions 44 of the inner tapered segment 30 will be aligned with the endpoint 38 of that tapered segment 30 along a common vertical radial plane, although the endpoint 38 will extend radially inward from the planar surface of the strip 22 along the junction 44 of the center portion 28 and tapered segment 30 a distance equal to the thickness t of the material used to fabricate the strip 22. Similarly, the outer tapered segment 32 will extend radially outward from the planar surface of the strip 22 along the junction 46 of the center portion 28 and tapered segment 32 a distance equal to the thickness t of the material used to fabricate the strip 22.

It should be understood that the inner planar surface of the inner tapered segment 30 may be used to define the inner circumference 48, in which case the inner circumference 48 would be defined as $2\pi(r-t)$. Similarly, the outer planar surface of the outer tapered segment 32 may be used to define the outer circumference 50, in which case the outer circumference 50 would be defined as $2\pi(R+t)$. However, in order to simplify the general calculations for determining the overall length of the strip 22 and the length of the center portion 28 as described below, and to facilitate calculation of the mass or volume of the core 12, the outer and inner radii R, r have been defined as shown along planes intersecting the Junctions 44, 46 and endpoints 38.

It may be seen that the equation for the volume V of the core is thereby $V = W\pi(R-r)^2 + Wt(S_i + S_o)$, or conversely $V = H\pi(R-r)^2 + Ht(S_i + S_o)$. Given a magnetic tape material having a density $\delta$, the mass M of the core 12 is thereby $M = \delta V$.

Although each junction 44, 46 is aligned with the corresponding endpoint 38 of the respective tapered segment 30, 32, the alignment between the junctions 44, 46 themselves or endpoints 38 themselves may vary by an alignment angle from zero to one radian (or one revolution of the wrapping) without disturbing the symmetry of the induced magnetic field leakage from the core 12. The alignment angle will, however, affect the overall length of the strip 22 and the mass of the core 12.

FIG. 5 shows an alignment angle equal to zero in which the junction 44 of the inner tapered segment 30 is aligned along a common radial plane and is most closely proximate to the junction 46 of the outer tapered segment 32. Conversely, FIG. 3 shows an alignment angle equal to 180° in which the Junction 44 of the inner tapered segment 30 is still aligned along a common radial plane but is spaced diametrically apart from the junction 46 of the outer tapered segment 32.

Since the value of $R-r$ will be equal to the number of generally concentric spiraling wrapped layers $N_1$ multiplied by the thickness t of the strip 22 when the junctions 44, 46 are aligned and most closely proximate as in FIG. 5, it may be shown that the length $L_a$ of the center portion 28 is given approximately by $L_a = 2\pi r[1 + N_1(N_1-1)t/2]$. The overall approximate length of the strip 22 would thus be $L_{T(a)} = S_i + S_o + 2\pi r[1 + N_1(N_1-1)t/2]$.

However, when the junctions 44, 46 diametrically oppose one another along a plane intersecting the radial axis A, such as in FIGS. 3 and 7, the core 12 may be thought of as having either $N_1\frac{1}{2}$ or $N_1 - \frac{1}{2}$ layers, since the inner or outer layer extends an additional one half revolution around the core 12, or conversely is shortened by one half revolution. To simplify this situation, the radii R and r are deemed to coincide with the plane intersecting the junction 44 of the inner tapered segment 30, and the core 12 thus has an additional partial outer layer having a length of $\pi R$. Since the outer radius R becomes a function of $r + N_1 t$, the length $L_d$ of the center portion 28 for diametrically opposed junctions 44, 46 would be given approximately by $L_d = 2\pi r[1 + N_1(N_1-1)t/2] + \pi(r + N_1 t)$. The overall approximate length of the strip 22 would thus be $L_{T(d)} = S_i + S_o + 2\pi r[1 + N_1(N_1-1)t/2] + \pi(r + N_1 t)$.

Given these general relationships, it is possible to determine with a relatively high degree of accuracy the necessary lengths $L_c$, $S_1$, and $S_o$ needed to fabricate a core 12 having desired inner and outer radii R, r, and relative alignment angle between the junctions 44, 46.

In the embodiment of the core 12 as shown in FIG. 3, the junctions 44, 46 between the center portion 28 and the tapered segments 30, 32 are diametrically opposed across the core 12. Any vertical plane bisecting the core 12 and intersecting the radial axis or centerline of the core 12 will produce up to four vertical line segments between the edges 34, 36 of the tapered segments 30, 32 having heights of $h_1$, $h_2$, $h_3$, and $H_4$. As may be seen in FIG. 4, in such a configuration the height $h_1$ of the inner tapered segment 30 along a line defined by a radial plane of the toroid (such as line 4—4 in FIG. 3) is balanced by the height $h_2$ of the outer tapered segment 32 intersected by that plane, the sum of the corresponding heights $h_1$ and $h_2$ of the inner and outer tapered segments 30, 32 at the intersection of that plane generally being a constant $k = H$. In that configuration, heights $h_3$ and $h_4$ (not shown in FIG. 4) would be equal to zero and H, respectively, and would similarly add to a constant $k = H$. As such, in any vertical plane intersecting the radial axis A of the core 12, one vertical line segment of the inner tapered segment 30 will have a height $h_1$ that may be added to the height $h_2$ of a vertical line segment of the outer tapered segment 32 to result in a constant $k = H$, and a second vertical line segment of the inner tapered segment 30 will have a height $h_3$ that may be added to the height $h_4$ of a vertical line segment of the outer tapered segment 32 to result in a constant $k = H$. Moreover, in any vertical plane intersecting the radial axis A of the core 12, the height $h_1$ or $h_3$ of a vertical line segment of each tapered segment 30, 32 will equal the height $h_2$ or $h_4$ of a vertical line segment of the diametrically opposed tapered segment 32, 30, respectively. Because the intensity of the leakage of the induced magnetic field at any point intersected by that plane will be proportional to the mass or volume of the tapered segments 30, 32 of the core 12 along that plane, the total leakage of the induced magnetic field within that plane will be symmetrically balanced across the diameter of the core 12. Consequently, the net leakage of the induced magnetic field along the edges 34, 36 of the tapered segments 30, 32 will be symmetrically balanced across each plane bisecting the core 12 and intersecting the radial axis A, and no appreciable asymmetry in the induced magnetic field will result that would affect measurement of the ambient magnetic field along an axis parallel with the radial axis of the core 12. (The term leakage has been used herein to refer to an induced field having directional components other than those preferred for optimal sensing, whereas a theoretically perfect tall-toroidal core of a solid material might be said to have no leakage or asymmetric anomalies, with the entire induced magnetic field being strictly oriented in the preferred directions with no structurally-induced discontinuities.)

An alternate embodiment of the core 12 is shown in FIGS. 2 and 6. In this alternate embodiment, each tapered segment 30, 32 is formed by a single tapered edge 52, 54 extending in a straight line between the longitudinal edges 40, 42 of the center portion 28, each tapered edge 52, 54 being oriented opposite to one another. In such an embodiment, each tapered end 30, 32 forms an endpoint 56 which is aligned along one of the longitudinal edges 40, 42, and a breaking point 58, 60 or Junction along the opposing longitudinal edge 42, 40 at which the taper begins. The respective lengths $S_i$, $S_o$ of the tapered segments 30, 32 respectively are measured along the untapered longitudinal edge 40, 42 from the endpoint 56 to a point on the longitudinal edge 40, 42 defined by a line perpendicular to that longitudinal edge 40, 42 and intersecting the corresponding Junction 58, 60. Calculations for the core 12 formed from the strip 22 having single tapered edges 52, 54 would be generally the same as for the core 12 having dual tapered edges 34, 36 in each tapered segment 30, 32. Referring to FIG. 6, a core 12 in which the tapered segments 30, 32 extend around one revolution of the inner and outer circumferences 48, 50 with an alignment angle of zero between the junctions 58, 60 is shown for purposes of establishing a base reference for the alignment angle.

In operation, the core 12 of this invention is wound with the primary or excitation winding or coil 14, equatorial winding or coil 16, first axial winding or coil 18, and second axial winding or coil 20. The primary or excitation winding 14 is applied first, however the equatorial winding 16 and axial windings 18, 20 may be applied in any conventional order that proves suitable.

Referring to FIG. 7, it may be seen that the excitation winding 14 is applied both axially and radially. That is, each loop of the winding 14 extends along and parallel with the height H or radial axis A of the core 12 along the inner and outer circumferences 48, 50, and parallel with at least one radial segment B along the top 24 and bottom 26 of the core 12, but completely around only one rectangular half-annulus of the core 12.

Referring to FIG. 8, it may be seen that the equatorial winding 16 extends in generally circular loops around the outer circumference 50 of the core 12, and is orthogonal to both the radial axis A and any radial segment B of the core 12.

Referring to FIG. 9, it may be seen that the axial windings 18, 20 are applied both axially and circumferentially. That is, each loop of the windings 18, 20 extends along and parallel with the height H or radial axis A of the core 12 along the outer circumference 50, and parallel with at two radial segments B along the top 24 and bottom 26 of the core 12, and completely around both rectangular half-annuli of the core 12 (i.e., the portion of each loop that is parallel with the radial axis A is disposed at or outside the outer circumference 50 of the core 12.) As such, the axial windings 18, 20 may also be considered axial and diametric windings 18, 20, as compared to the axial and radial excitation winding 14.

The pair of ends of leads 62 of the excitation windings are electrically connected to an appropriate drive circuit (not shown), and each pair of ends or leads 64, 66, 68 of the equatorial and axial sensing windings 16, 18, 20 are electrically connected to an appropriate sensing and filtering circuit (not shown) which measures and computes the directional vector components and intensity of the ambient magnetic field and relays that information to a remote device such as a display, guidance or telemetry system, or memory.

The core 12 and magnetometer 10 may be fabricated and assembled having any desired dimensions, the greater the size and mass of the core 12 and sensing coils 16, 18, 20 the greater the sensitivity of the magnetometer 10. However, in many applications a magnetometer of minimum dimensions is desired.

One representative example of this magnetometer 10 utilizes a magnetic tape material having a thickness t on the order of 0.003" to 0.005" to form a core 12 having a height approximately equal to the outer diameter (2R) within a range of approximately ±25%, the height and diameter of the core 12 being approximately 3/16" with the length of the strip 22 being such that 8-12 generally concentric spiraling layers may be formed. The core 12 is wrapped with 100 turns of #44 wire for the primary or excitation winding 14, and approximately 200 turns of #44 wire for each of the equatorial and axial sensing windings 16, 18, 20. This produces a core 12 having outside dimensions for height and diameter of approximately ¼". Magnetometers 10 of smaller overall dimensions can also be assembled, however it may be necessary to decrease the number of windings and the diameter of the wire utilized, as well as to decrease the thickness t of the strip 22 in order to permit the strip 22 to be wrapped into the toroidal shape. It should be noted that a fine wire such as #60 wire has a sufficiently small diameter that it becomes difficult to wind even manually, and greater care must be taken in assembling the magnetometer 10. In the example provided above, in order to achieve a magnetometer 10 having overall dimensions of approximately ¼", the number of turns of wire for the excitation winding 14 was reduced from a preferred 200 turns to the 100 turns used, and the number of turns of wire for the sensing windings 16, 18, 20 was reduced from a preferred 1000 turns to the 200 turns used.

A suitable magnetometer 10 for sensing the earth's magnetic field would have an overall diameter and height on the order of ½", and an extraordinarily sensitive magnetometer 10 may be constructed utilizing a core 12 having a diameter on the order of 2". While the magnetic field leakage increases proportionately with an increase in the length of the tapered edges 34, 36 of the strip 22, the enhanced sensitivity resulting from the increased mass of the core 12 offsets the increased field leakage, which remains symmetrical across the core 12 in any event.

Another representative example of this magnetometer 10 that has proven superior in some applications utilizes a magnetic tape material having a thickness t on the order of 0.002" to 0.003" to form a core 12 having a height equal to approximately one and one half times the outer diameter (2R), the height of the core 12 being approximately 3/16" with a reduced outer diameter (2R). This results in a height to diameter ratio of 1.5 (height/diameter = 1.5 or height:diameter of 1.5:1). The strip 22 has a length of approximately 3', with the strip 22 initially being varnished with a non-conductive urethane varnish to insulate the spiraling layers and reduce or eliminate eddy currents within the core 12.

It may be appreciated that other embodiments of core 12 and single core triaxial magnetometer 10 of this invention may be constructed to achieve greater sensitivity or further reduce the amount or asymmetry of the leakage of the induced magnetic field in certain applications, however fabrication of these embodiments may be more difficult and expensive. For example, since the leakage of the induced magnetic field is perpendicular to the edges 34, 36 of the tapered segments 30, 32 (or any structural discontinuity), the leakage of the induced magnetic field from the inner tapered segment 30 will be oriented at a slight angle relative to the radial axis A of the core 12, that angle being directed oppositely to the angle at which the leakage of the induced magnetic field from the outer tapered segment 32 will be oriented. Although the orientation of the two leakages of the induced magnetic field along the top 24 of the core 12 will oppose one another, they will be effectively balanced by one of the two leakages of the induced magnetic field along the bottom 26 of the core 12. Such is not the case in the core 12 having single edges 52, 54 in the tapered segments 30, 32. The leakage of the induced magnetic field between the edges 34, 36 of the inner and outer tapered segments 30, 32 relative to the radial axis A will also be slightly skewed relative to one another, due to the difference in angles formed by the tapered edges 34, 36 of the two tapered segments 30, 32 relative to vertical. Since the angle of the induced magnetic field along these edges 34, 36 relative to the radial axis A of the core 12 would be given by the $\tan^{-1}(W/S_o)$ and the $\tan^{-1}(W/S_i)$, these angles will differ depending upon the difference between the lengths $S_o$ and $S_i$. This difference will be negligible in most cases.

Since the leakage of the induced magnetic field from the edges 34, 36 will have a component aligned with the sensing plane of one or both of the two axial windings 18, 20, and will not be completely symmetrical, an effort to filter that component or reduce the asymmetry may be desired in some applications. One possible alternative would be curving the edges 34, 36 to increase the directional symmetry of the leakage. Such measures have not yet proven necessary for the intended uses of the magnetometer 10.

While the preferred embodiment of the above single core triaxial flux-gate magnetometer 10 has been described in detail with reference to the attached drawing figures, it is understood that various changes and adaptations may be made in the single core triaxial flux-gate magnetometer 10 disclosed above without departing from the spirit and scope of the appended claims.

What is claimed is:

1. A flux-gate magnetometer core which may be electrically excited to induce a magnetic field, said flux-gate magnetometer core comprising:

a strip of a magnetically permeable material wrapped to form a toroid, said toroid having an inner circumference, an outer circumference, and a radial axis, said strip including a center portion having a pair of opposing ends and at least one longitudinal edge, a first tapered segment extending from and connected to a first end of said pair of opposing ends of said strip, said first tapered segment having at least one first tapered edge extending at a first angle relative to said at least one longitudinal edge from a first junction between said longitudinal edge and said tapered edge of said first tapered segment to a first endpoint, said first tapered segment having a first length being substantially equal to a first integer multiple of said inner circumference of the core, and a second tapered segment extending from and connected to a second end of the pair of opposing ends of said strip, said second tapered segment having at least one second tapered edge extending at a second angle relative to said at least one longitudinal edge from a second junction between said longitudinal edge and said tapered edge of said second tapered segment to a second endpoint, said second tapered segment having a second length being substantially equal to a second integer multiple of said outer circumference of the core, said first junction being substantially aligned with said second endpoint in a first vertical plane intersecting said radial axis, and said second junction being substantially aligned with said first endpoint in a second vertical plane intersecting said radial axis, whereby an induced magnetic field leaking from a first point along the first tapered edge and from a second point along the second tapered edge within a common vertical plane intersecting both the radial axis of the core and said first and second points will be substantially uniform and symmetrical about the flux-gate magnetometer core.

2. The flux-gate magnetometer core of claim 1 wherein the number of first tapered edges of the first tapered segment is two, the first length of each of the first tapered edges being substantially equal to one another, and wherein the number of second tapered edges of the second tapered segment is two, the second length of each of the second tapered edges being substantially equal to one another.

3. The flux-gate magnetometer core of claim 1 wherein the strip has a centerline intersecting the first endpoint and the second endpoint, and further wherein the number of longitudinal edges of the strip is two, the longitudinal edges being spaced apart on opposing sides of and substantially equidistant from and parallel with said centerline.

4. The flux-gate magnetometer core of claim 1 wherein the toroid is a tall toroid.

5. The flux-gate magnetometer core of claim 1 wherein the toroid has a height and a diameter, said height being substantially equal to or greater than said diameter.

6. The flux-gate magnetometer core of claim 1 wherein the toroid has a height and a diameter, said height being within a range of about 1 to about 1.5 times said diameter.

7. The flux-gate magnetometer core of claim 1 wherein the toroid has a height and a diameter, said height being substantially equal to 1.5 times said diameter.

8. The flux-gate magnetometer core of claim 1 wherein the toroid has a height, said height being substantially equal to or less than 3/16 inch.

9. The flux-gate magnetometer core of claim 8 wherein the toroid has a diameter, said diameter being substantially equal to or less than the height.

10. The flux-gate magnetometer core of claim 1 wherein the first integer multiple and the second integer multiple are equal to one.

11. The flux-gate magnetometer core of claim 1 wherein the strip is wrapped to form a plurality of substantially concentric spiraling layers.

12. The flux-gate magnetometer core of claim 11 wherein the number of the plurality of substantially concentric spiraling layers is on the order of ten.

13. The flux-gate magnetometer core of claim 11 wherein the number of the plurality of substantially concentric spiraling layers is between five and twenty five.

14. The flux-gate magnetometer core of claim 1 wherein the toroid is a tall toroid having a height and a diameter, said height being equal to or greater than said diameter.

15. The flux-gate magnetometer core of claim 1 wherein the toroid is a tall toroid having a height and a diameter, said height being within a range of about 1 to about 1.5 times said diameter.

16. The flux-gate magnetometer core of claim 1 wherein the toroid is a tall toroid having a height less than or equal to $\frac{1}{4}$ inch.

17. The flux-gate magnetometer core of claim 1 wherein the first integer multiple and the second integer multiple are equal to one.

* * * * *

UNITED STATES PATENT AND TRADEMARK OFFICE
CERTIFICATE OF CORRECTION

PATENT NO. : 5,329,269
DATED     : July 12, 1994
INVENTOR(S) : Watson

It is certified that error appears in the above-indentified patent and that said Letters Patent is hereby corrected as shown below:

Column 4, line 65 following "between the," delete "Junctions" and substitute --junctions--therefor.

Signed and Sealed this

Eleventh Day of April, 1995

*Attest:*

BRUCE LEHMAN

*Attesting Officer*  *Commissioner of Patents and Trademarks*